United States Patent
Shih et al.

(12)

(10) Patent No.: US 10,262,862 B1
(45) Date of Patent: Apr. 16, 2019

(54) METHOD OF FORMING FINE INTERCONNECTION FOR SEMICONDUCTOR DEVICES

(71) Applicant: NANYA TECHNOLOGY CORPORATION, New Taipei (TW)

(72) Inventors: Chiang-Lin Shih, New Taipei (TW); Shing-Yih Shih, New Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 15/894,095

(22) Filed: Feb. 12, 2018

Related U.S. Application Data

(60) Provisional application No. 62/608,801, filed on Dec. 21, 2017.

(51) Int. Cl.
| H01L 21/311 | (2006.01) |
| H01L 21/033 | (2006.01) |
| H01L 21/28  | (2006.01) |
| H01L 21/768 | (2006.01) |
| H01L 21/762 | (2006.01) |

(52) U.S. Cl.
CPC .... *H01L 21/0337* (2013.01); *H01L 21/28238* (2013.01); *H01L 21/31127* (2013.01); *H01L 21/76205* (2013.01); *H01L 21/76831* (2013.01); *H01L 21/76816* (2013.01); *H01L 21/76892* (2013.01)

(58) Field of Classification Search
CPC ......... H01L 21/76831; H01L 21/76205; H01L 21/28238; H01L 21/31127; H01L 21/47573

USPC ........ 438/696, 699, 700, 723, 725, 756, 757
See application file for complete search history.

(56) References Cited

U.S. PATENT DOCUMENTS

| 10,043,746 B1* | 8/2018 | Cheng ................ H01L 23/5256 |
| 2007/0249170 A1* | 10/2007 | Kewley .............. H01L 21/0337 438/706 |
| 2015/0372140 A1* | 12/2015 | Liu ..................... H01L 29/7848 257/190 |
| 2016/0225714 A1* | 8/2016 | Yun .................... H01L 27/11573 |
| 2017/0373188 A1* | 12/2017 | Mochizuki .......... H01L 29/7827 |
| 2018/0040623 A1* | 2/2018 | Kanakamedala .......................... H01L 27/11556 |

(Continued)

*Primary Examiner* — Binh X Tran
(74) *Attorney, Agent, or Firm* — Muncy, Geissler, Olds & Lowe, P.C.

(57) ABSTRACT

The present disclosure provides a method of forming fine interconnection for semiconductor devices. The method includes the following steps: A substrate is provided. A first core layer is formed over the substrate. The first core layer includes a base portion, a plurality of extending line portions extending from the base portion along a first direction, and a plurality of isolated line portions isolated from the base portion. Subsequently, a spacer is formed on the sidewalls of the first core layer. A second core layer is then formed to over the substrate. The second core layer includes a plurality of surrounding line portions surrounding the plurality of isolated line portions, and includes a plurality of enclosed line portions enclosed by the plurality of extending line portions. The spacer is removed to form a plurality of openings between the first core layer and the second core layer. The first core layer and the second core layer are alternately arranged along a second direction perpendicular to the first direction after removing the spacer.

18 Claims, 13 Drawing Sheets

(56) References Cited

U.S. PATENT DOCUMENTS

2018/0190759 A1* 7/2018 Yang .................. H01L 23/5223
2018/0261507 A1* 9/2018 Jacobi ............. H01L 21/823456

* cited by examiner

METHOD OF FORMING FINE INTERCONNECTION FOR SEMICONDUCTOR DEVICES

PRIORITY CLAIM AND CROSS-REFERENCE

This patent application claims priority to U.S. patent application Ser. No. 62/608,801, filed on Dec. 21, 2017, which is incorporated by reference in its entirety.

TECHNICAL FIELD

The present disclosure relates to a method for preparing semiconductor structures, and more particularly, to a method of forming fine interconnection for semiconductor devices.

DISCUSSION OF THE BACKGROUND

In semiconductor manufacturing processes, photolithography techniques are commonly adopted to define structures. Typically, an integrated circuit layout is designed and outputted onto one or more photomasks. The integrated circuit layout is then transferred from the photomask(s) to a mask layer to form a mask pattern, and to a target layer from the mask pattern. However, with the advancing miniaturization and integration requirements of semiconductor devices, including memory devices such as dynamic random access memories (DRAMs), flash memories, static random access memories (SRAMs), and ferroelectric (FE) memories, the semiconductor structures or features for such devices become finer and more miniaturized as well. Accordingly, the continual reduction in semiconductor structure and feature sizes places ever-greater demands on the techniques used to form the structures and features.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

The present disclosure provides a method of forming fine interconnection for semiconductor devices. The method includes the following steps: A substrate is provided. A first core layer is formed to over the substrate. The first core layer includes a base portion, a plurality of extending line portions extending from the base portion along a first direction, and a plurality of isolated line portions isolated from the base portion. Subsequently, a spacer is formed on the sidewalls of the first core layer. A second core layer is then formed over the substrate. The second core layer includes a plurality of surrounding line portions surrounding the plurality of isolated line portions, and a plurality of enclosed line portions enclosed by the plurality of extending line portions. The spacer is removed to form a plurality of openings between the first core layer and the second core layer. The first core layer and the second core layer are alternately arranged along a second direction perpendicular to the first direction after removing the spacer.

In some embodiments, the plurality of isolated line portions are separated from the plurality of extending line portions by the plurality of surrounding line portions.

In some embodiments, in a cross-sectional view taken along the second direction, the widths in the second direction of the plurality of isolated line portions, the plurality of extending line portions, the plurality of surrounding line portions, and the plurality of enclosed line portions are essentially identical.

In some embodiments, the plurality of isolated line portions, the plurality of extending line portions, the plurality of surrounding line portions, and the plurality of enclosed line portions are spaced apart from each other by the plurality of openings.

In some embodiments, in a cross-sectional view taken along the second direction, the plurality of surrounding line portions are on the two sides of the plurality of isolated line portions and are separated from them by the plurality of openings.

In some embodiments, in a cross-sectional view taken along the second direction, the plurality of extending line portions are on the two sides of the plurality of enclosed line portions and are separated from them by the plurality of openings.

In some embodiments, the first core layer includes another base portion, wherein the plurality of extending line portions are connected between the two base portions.

In some embodiments, the plurality of isolated line portions are isolated from the another base portion.

In some embodiments, the first core layer and the second core layer comprise the same material.

In some embodiments, the step of forming the first core layer further includes the following steps: A first sacrificial layer and a patterned photoresist are sequentially formed over the substrate. The first sacrificial layer is then etched through the patterned photoresist to form the first core layer.

In some embodiments, the step of forming the first core layer further includes the step of performing a trimming step on the patterned photoresist before etching the first sacrificial layer.

In some embodiments, the step of forming the spacer on the sidewalls of the first core layer further includes the following steps: The spacer is formed over the first sacrificial layer. The top portions of the spacer are removed while the side portions of the spacer are left on the sidewalls of the first core layer.

In some embodiments, the step of forming the second core layer further includes the following steps: A second sacrificial layer is formed on the substrate. The top portions of the second sacrificial layer are removed to expose the first core layer and the spacer covering the sidewalls of the first core layer.

In some embodiments, the substrate further comprises a hard mask formed thereon.

In some embodiments, the method of forming fine interconnection for semiconductor devices further includes the following steps: The hard mask is etched through the plurality of openings to form a plurality of combination line portions. The plurality of combination line portions are separated into a plurality of fine interconnections.

In some embodiments, the plurality of fine interconnections include metal pads.

In some embodiments, the step of separating the plurality of combination line portions into the plurality of fine interconnections further includes the following steps: The hard mask is stripped away. A third sacrificial layer is formed over the substrate. A positive photoresist is formed over the third sacrificial layer. The third sacrificial layer is etched through the positive photoresist to form the plurality of fine interconnections.

In some embodiments, in a cross-sectional view taken along the second direction, the widths in the second direction of the plurality of fine interconnections are essentially identical.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description.

FIGS. 3A to 3C are schematic diagrams illustrating a fabrication stage of the method of forming fine interconnection for semiconductor devices in accordance with some embodiments of the present disclosure, wherein FIG. 3B is a cross-sectional view taken along line A-A' of FIG. 3A, and FIG. 3C is a cross-sectional view taken along line B-B' of FIG. 3A.

FIGS. 4A to 4C are schematic diagrams illustrating a fabrication stage of the method of forming fine interconnection for semiconductor devices in accordance with some embodiments of the present disclosure, wherein FIG. 4B is a cross-sectional view taken along line A-A' of FIG. 4A, and FIG. 4C is a cross-sectional view taken along line B-B' of FIG. 4A.

FIGS. 5A to 5C are schematic diagrams illustrating a fabrication stage of the method of forming fine interconnection for semiconductor devices in accordance with some embodiments of the present disclosure, wherein FIG. 5B is a cross-sectional view taken along line A-A' of FIG. 5A, and FIG. 5C is a cross-sectional view taken along line B-B' of FIG. 5A.

FIGS. 6A to 6C are schematic diagrams illustrating a fabrication stage of the method of forming fine interconnection for semiconductor devices in accordance with some embodiments of the present disclosure, wherein FIG. 6B is a cross-sectional view taken along line A-A' of FIG. 6A, and FIG. 6C is a cross-sectional view taken along line B-B' of FIG. 6A.

FIGS. 7A to 7C are schematic diagrams illustrating a fabrication stage of the method of forming fine interconnection for semiconductor devices in accordance with some embodiments of the present disclosure, wherein FIG. 7B is a cross-sectional view taken along line A-A' of FIG. 7A, and FIG. 7C is a cross-sectional view taken along line B-B' of FIG. 7A.

FIGS. 8A to 8C are schematic diagrams illustrating a fabrication stage of the method of forming fine interconnection for semiconductor devices in accordance with some embodiments of the present disclosure, wherein FIG. 8B is a cross-sectional view taken along line A-A' of FIG. 8A, and FIG. 8C is a cross-sectional view taken along line B-B' of FIG. 8A.

FIGS. 10A to 10C are schematic diagrams illustrating a fabrication stage of the method of forming fine interconnection for semiconductor devices in accordance with some embodiments of the present disclosure, wherein FIG. 10B is a cross-sectional view taken along line A-A' of FIG. 10A, and FIG. 10C is a cross-sectional view taken along line B-B' of FIG. 10A.

FIGS. 11A to 11C are schematic diagrams illustrating a fabrication stage of the method of forming fine interconnection for semiconductor devices in accordance with some embodiments of the present disclosure, wherein FIG. 11B is a cross-sectional view taken along line A-A' of FIG. 11A, and FIG. 11C is a cross-sectional view taken along line B-B' of FIG. 11A.

FIGS. 12A to 12C are schematic diagrams illustrating a fabrication stage of the method of forming fine interconnection for semiconductor devices in accordance with some embodiments of the present disclosure, wherein FIG. 12B is a cross-sectional view taken along line A-A' of FIG. 12A, and FIG. 12C is a cross-sectional view taken along line B-B' of FIG. 12A.

FIGS. 13A to 13C are schematic diagrams illustrating a fabrication stage of the method of forming fine interconnection for semiconductor devices in accordance with some embodiments of the present disclosure, wherein FIG. 13B is a cross-sectional view taken along line A-A' of FIG. 13A, and FIG. 13C is a cross-sectional view taken along line B-B' of FIG. 13A.

DETAILED DESCRIPTION

Figure 1:
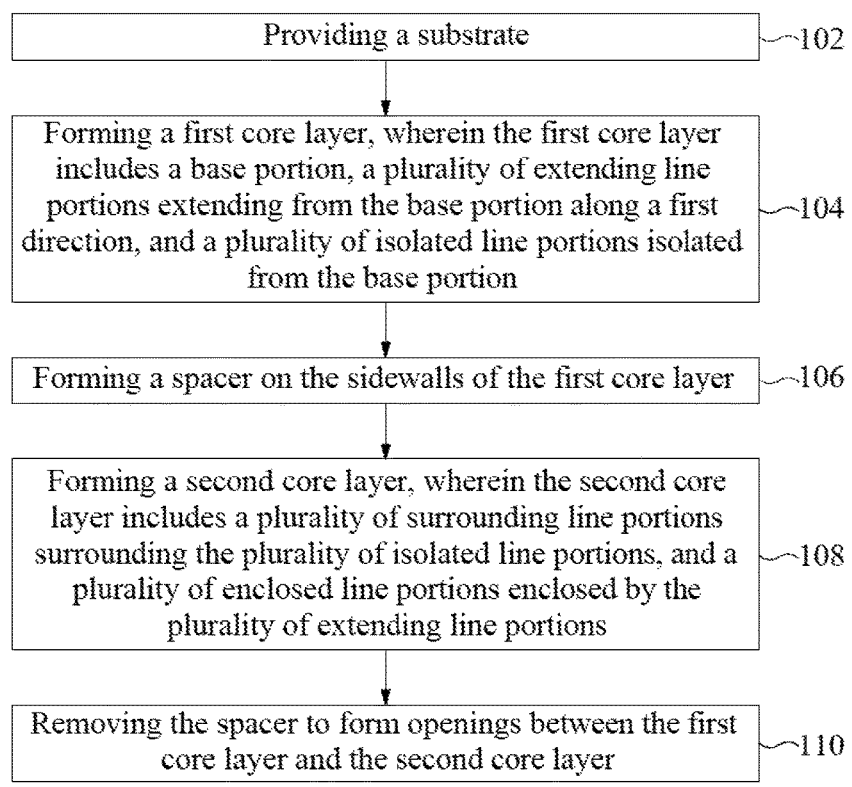
FIG. 1 is a flow diagram illustrating a method of forming fine interconnection for semiconductor devices, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing to particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

As used herein, the term "feature" refers to parts of a pattern, such as lines, spaces, via, pillars, trenches, troughs, or moats. As used herein, the term "core" refers a mask feature formed at a vertical level. As used herein, "target layer" refers to a layer in which a pattern of semiconductor structures is to be formed. A target layer may be part of the substrate. A target layer may be a metal layer, a semiconductor layer, or an insulating layer formed over the substrate.

As used herein, the terms "patterning" or "patterned" are used in the present disclosure to describe an operation of forming a predetermined pattern on a surface. The patterning operation includes various steps and processes and varies in accordance with different embodiments. In some embodiments, a patterning process is adopted to pattern an existing film or layer. The patterning process includes forming a mask on the existing film or layer and removing the unmasked film or layer with an etch or other removal process. The mask can be a photoresist or a hard mask. In some embodiments, a patterning process is adopted to form a patterned layer directly on a surface. The patterning process includes forming a photosensitive film on the surface, conducting a photolithography process, and performing a developing process. The remaining photosensitive film is retained and integrated into the semiconductor device.

FIG. 1 is a flow diagram illustrating a method of forming fine interconnection for semiconductor devices, in accordance with some embodiments of the present disclosure.

Referring to FIG. 1, the method 10 of forming fine interconnection for semiconductor devices includes a step 102, providing a substrate. The method 10 of forming fine interconnection for semiconductor devices further includes a step 104, forming a first core layer. The first core layer includes a base portion, a plurality of extending line portions extending from the base portion along a first direction, and a plurality of isolated line portions isolated from the base portion. The method 10 of forming fine interconnection for semiconductor devices further includes a step 106, forming a spacer on the sidewalls of the first core layer. The method 10 of forming fine interconnection for semiconductor devices further includes a step 108, forming a second core layer. The second core layer includes a plurality of surrounding line portions surrounding the plurality of isolated line portions, and a plurality of enclosed line portions enclosed by the plurality of extending line portions. The method 10 of forming fine interconnection for semiconductor devices further includes a step 110, removing the spacer to form a plurality of openings between the first core layer and the second core layer. The first core layer and the second core layer are alternately arranged along a second direction perpendicular to the first direction after removing the spacer. The method 10 of forming fine interconnection for semiconductor devices will be further described according to one or more embodiments.

Figure 2A:
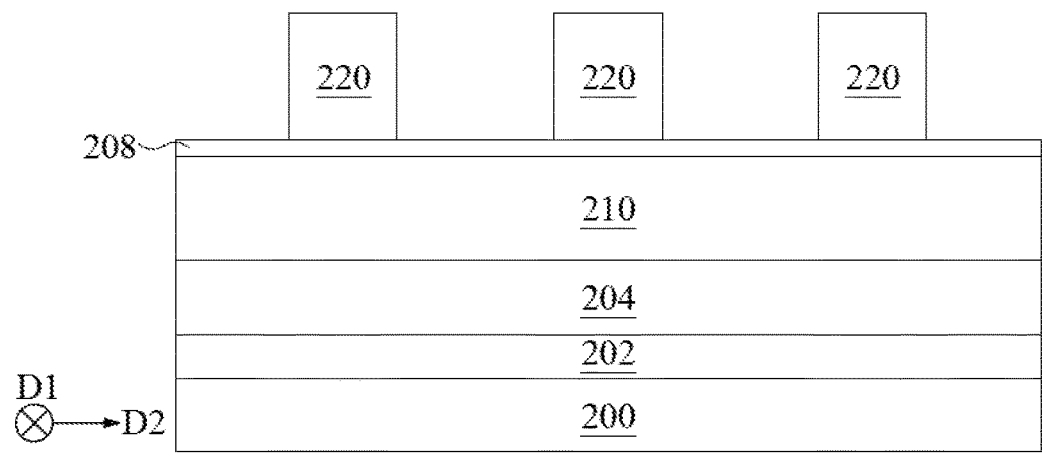
FIGS. 2A and 2B are schematic diagrams illustrating fabrication stages of the method of forming fine interconnection for semiconductor devices in accordance with some embodiments of the present disclosure.
Figure 2B:
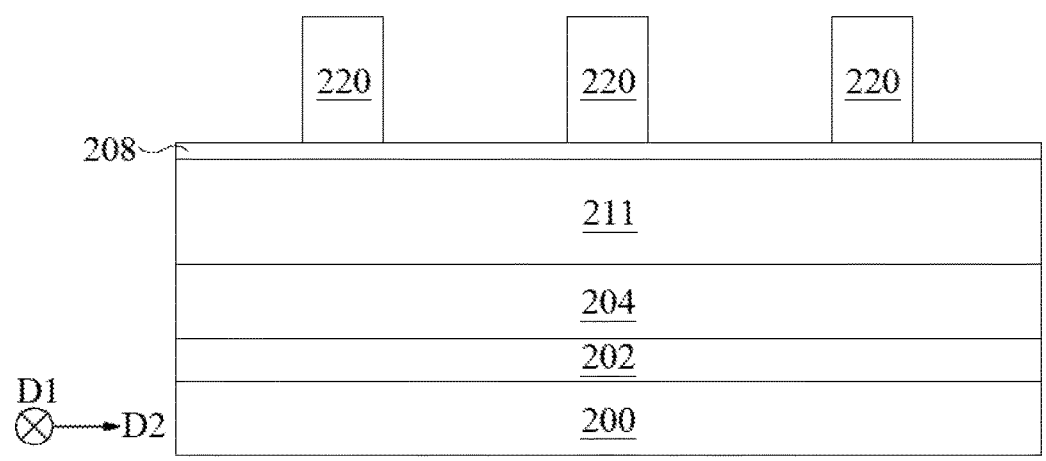

To facilitate understanding of step 102, providing a substrate, please see FIGS. 2A and 2B. FIGS. 2A and 2B are schematic diagrams illustrating fabrication stages of the method 10 of forming fine interconnection for semiconductor devices in accordance with some embodiments of the present disclosure.

Referring to FIG. 2A, a substrate 200 is provided according to step 102. Examples of the substrate materials can include, for example but not limited to, silicon (Si), gallium (Ga), gallium arsenide (GaAs), gallium nitride (GaN), strained silicon, silicon-germanium (SiGe), silicon carbide (SiC), diamond, epitaxy layer or a combination thereof.

Still referring to FIG. 2A, in some embodiments of the present disclosure, a target layer 202 is formed over the substrate 200. The target layer 202 can include multiple layers or a single layer. The target layer 202 may be a layer in which various IC components, parts, or structures are to be formed through IC fabrication processes. Examples of the components, parts, or structures include transistors, capacitors, resistors, diodes, conductive lines, electrodes, spacers, and trenches. The target layer 202 can include materials that are selected based on the types of devices to be formed. Examples of the target layer materials include, for example but not limited to, dielectric materials, semiconductive materials, and conductive materials.

Still referring to FIG. 2A, a hard mask 204 is provided over the target layer 202 and the substrate 200. In some embodiments of the present disclosure, the hard mask 204 is a multi-layered structure. One of ordinary skill in the art would easily understand that the present disclosure may select a single hard mask or a bi-layered hard mask based on cost, time, performance, and processing considerations for a given application. The hard mask 204 can include, for example but not limited to, a carbon (C) material, a silicon (Si) material, a silicon oxide (SiO) material, a silicon nitride (SiN) material, or a silicon oxynitride (SiON) material.

Still referring to FIG. 2A, the method proceeds to step 104, forming a first core layer. A first sacrificial layer 210 is formed over the substrate 200. In some embodiments of the present disclosure, the first sacrificial layer 210 is formed over the hard mask 204. The first sacrificial layer 210 can include, for example but not limited to, spin-on dielectrics, and the spin-on dielectrics can include a silicon oxide (SiO) material or a silicon nitride (SiN) material.

Still referring to FIG. 2A, additionally, a mask layer 208 can be selectively formed over the first sacrificial layer 210. However, in some embodiments of the present disclosure, the mask layer 208 can be omitted. In some embodiments of the present disclosure, the mask layer 208 may provide improved etch selectivity and/or antireflective properties for removing the first sacrificial layer 210, and may provide a substantially planar surface on which additional materials may be formed. Over the mask layer 208 and/or the first sacrificial layer 210, a patterned photoresist 220 is formed as shown in FIG. 2A. The patterned photoresist 220 can include lines formed by performing, for example but not limited to, conventional photolithography, as is known in the art of semiconductor manufacturing.

Referring to FIG. 2B, in some embodiments of the present disclosure, a trimming step can be performed on the patterned photoresist 220, such that a width of the patterned photoresist 220 can be further reduced as shown in FIGS. 2A and 2B. However, in some embodiments of the present disclosure, when the patterned photoresist 220 including the desired width is formed by the conventional photolithography, the trimming step can be omitted.

Figure 3A:
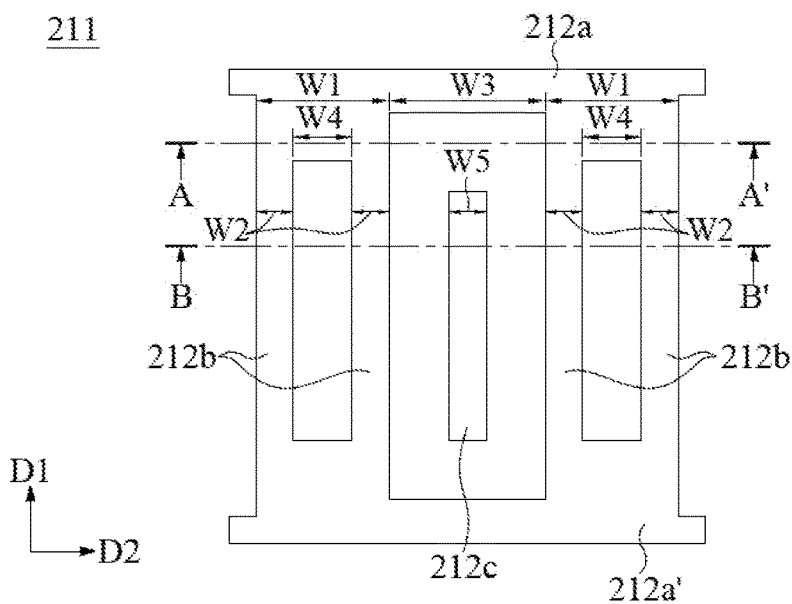
Figure 3B:
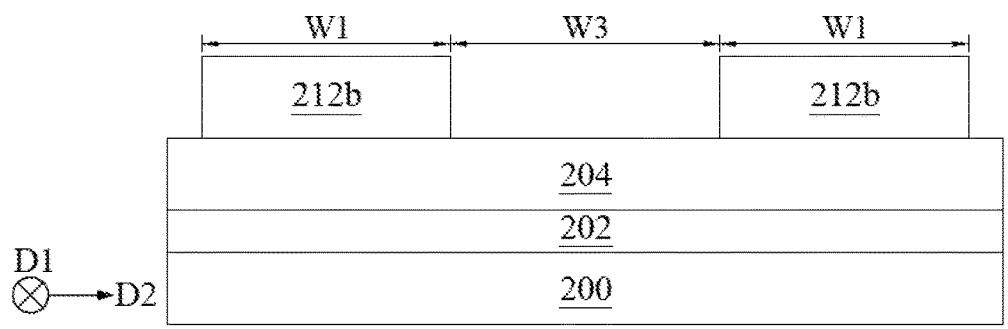
Figure 3C:
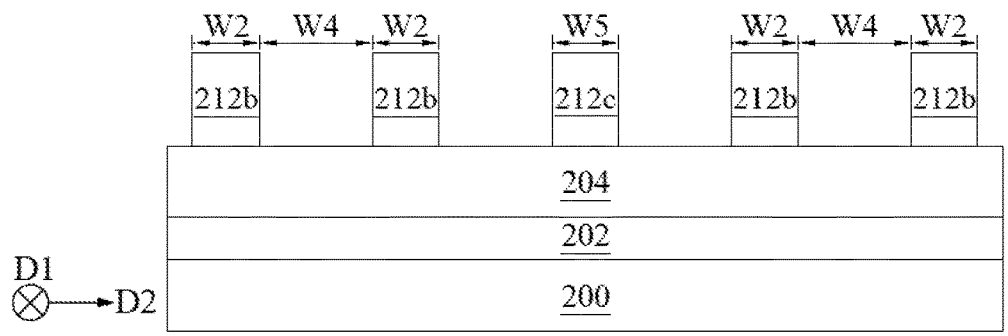

For further understanding of step 104, forming a first core layer, please refer to FIGS. 3A to 3C. FIGS. 3A to 3C are schematic diagrams illustrating a fabrication stage of the method of forming fine interconnection for semiconductor devices in accordance with some embodiments of the present disclosure, wherein FIG. 3B is a cross-sectional view taken along line A-A' of FIG. 3A, and FIG. 3C is a cross-sectional view taken along line B-B' of FIG. 3A. The first sacrificial layer 210 is then etched through the patterned photoresist 220 to form a first core layer 211 over the substrate 200 according to step 104. It should be easily realized by those skilled in the art that the first core layer 211 includes the lines as defined by the patterned photoresist 220. Thereafter, the patterned photoresist 220 is removed.

Still referring to FIGS. 3A to 3C, the first core layer 211 includes a base portion 212a, a plurality of extending line portions 212b extending from the base portion 212a along a first direction D1, and a plurality of isolated line portions 212c isolated from the base portion 212a. It should be understood that the plurality of extending line portions 212b and the plurality of isolated line portions 212c are the part where the present disclosure focus, wherein the plurality of extending line portions 212b are connected to another part, such as the base portion 212a, and the plurality of isolated line portions 212c are isolated from the another part.

Still referring to FIGS. 3A to 3C, the plurality of extending line portions 212b are connected with the base portion 212a at joints having to widths W1, and the joints are spaced with each other by an opening having width W3. Moreover, the plurality of extending line portions 212b further extend from the joints along the first direction D1 and divide into at least two lines having widths W2, wherein the two lines are spaced with each other by an opening having width W4. In some embodiments, the width W1 of extending line portions 212b at the joints is greater than the width W2 of the extending line portions 212b. In some embodiments, the width W3 of the opening that separating the joints is greater than the width W4 of the opening that separating the extending line portions 212b, but the disclosure is not limited thereto.

Still referring to FIGS. 3A to 3C, in some embodiments of the present disclosure, the plurality of extending line portions 212b can extend from the base portion 212a without dividing into thinner lines and changing the widths, that is, no joints exist. It is to be noticed that the plurality of extending line portions 212b are lines extending from the base portion 212a regardless of the widths throughout the present disclosure.

Still referring to FIGS. 3A to 3C, the plurality of isolated line portions 212c are located in the opening having the width W3, and between the plurality of extending line portions 212b. As shown in FIGS. 3A and 3C, the isolated line portions 212c are separated from the extending line portions 212b and the base portion 212a by the opening. Further, the plurality of isolated line portions 212c extend along with the plurality of extending line portions 212b in the first direction D1.

Still referring to FIGS. 3A to 3C, the plurality of isolated line portions 212c have width W5. In some embodiments of the present disclosure, width W5 is essentially identical to width W2, but the disclosure is not limited thereto.

It should be understood that although the thinnest lines of the extending line portions 212b are four lines as illustrated in FIGS. 3A to 3C for simplicity of explanation, any number of the thinnest lines may be formed, as will be apparent to one of ordinary skill in the art upon consideration of the present disclosure. For example, the plurality of extending line portions 212b can extend from the base portion 212a and then divide into more lines, but the disclosure is not limited thereto. Also, it should be understood that although one line of the isolated line portions 212c is illustrated in FIGS. 3A to 3C for simplicity of explanation, any number of lines may be formed, as will be apparent to one of ordinary skill in the art upon consideration of the present disclosure.

Still referring to FIGS. 3A to 3C, the plurality of extending line portions 212b and the plurality of isolated line portions 212c are extend along the first direction D1 and arranged along a second direction D2 perpendicular to the first direction D1. In some embodiments, the base portion 212a extends in the second direction D2.

Still referring to FIGS. 3A to 3C, in some embodiments of the present disclosure, the first core layer 212 includes another base portion 212a'. However, the another base portion 212a' can be omitted in some embodiments of the present disclosure. In the embodiments including the another base portion 212a', the plurality of extending line portions 212b are connected between the base portions 212a and the base portions 212a'. In the embodiments including the another base portion 212a', the plurality of isolated line portions 212c are isolated to from both the base portions 212a and the base portions 212a'. It should be understood that while the following figures do not show the another base portion 212a' for the sake of concision, the disclosure is not limited thereto.

Figure 4A:
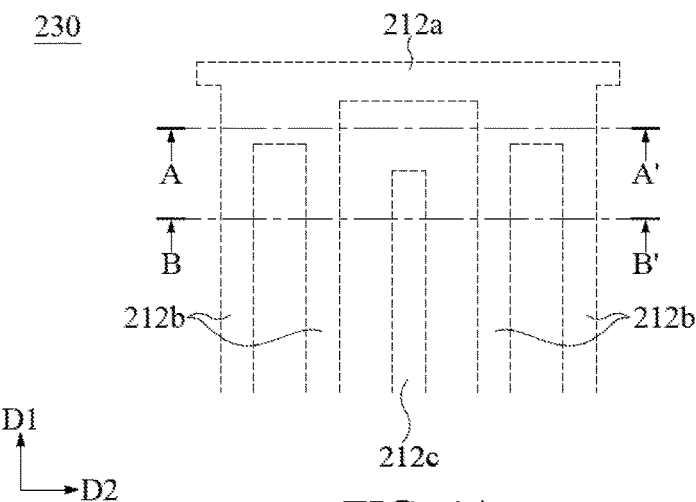
Figure 4B:
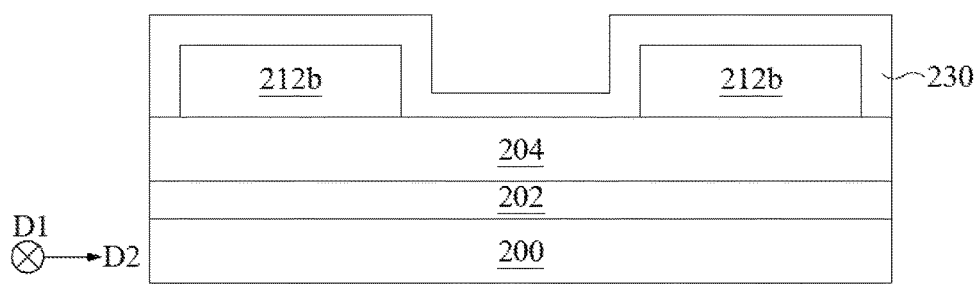
Figure 4C:
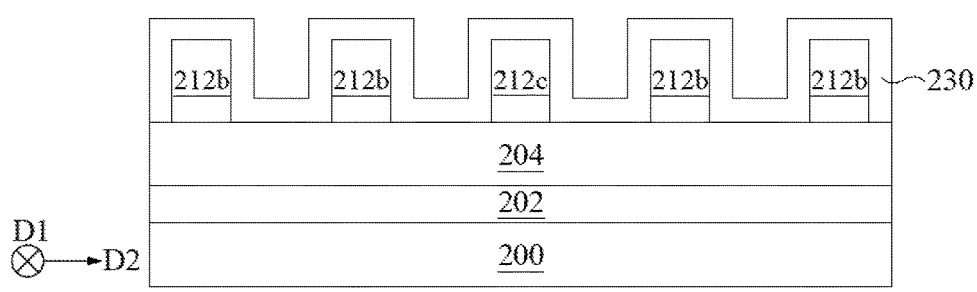

To facilitate understanding of step 106, forming a spacer on the sidewalls of the first core layer, please see FIGS. 4A to 4C. FIGS. 4A to 4C are schematic diagrams illustrating a fabrication stage of the method of forming fine interconnection for semiconductor devices in accordance with some embodiments of the present disclosure, wherein FIG. 4B is a cross-sectional view taken along line A-A' of FIG. 4A, and FIG. 4C is a cross-sectional view taken along line B-B' of FIG. 4A. A spacer 230 is conformally formed to cover or coat sidewalls and top surfaces of each of the extending line portions 212b and the isolated line portions 212c as shown in FIGS. 4A to 4C. The spacer 230 can include materials different from those of the first core layer 211, but the disclosure is not limited thereto. In some embodiments of the present disclosure, the spacer 230 can include, for example but not limited to, silicon nitride (SiN), silicon oxide (SiO), silicon oxynitride (SiON), a combination thereof, a stack layer thereof, or the like. In some embodiments of the present disclosure, the spacer 230 can be formed by atomic layer deposition or atomic layer chemical vapor deposition, but the disclosure is not limited thereto.

Figure 5A:
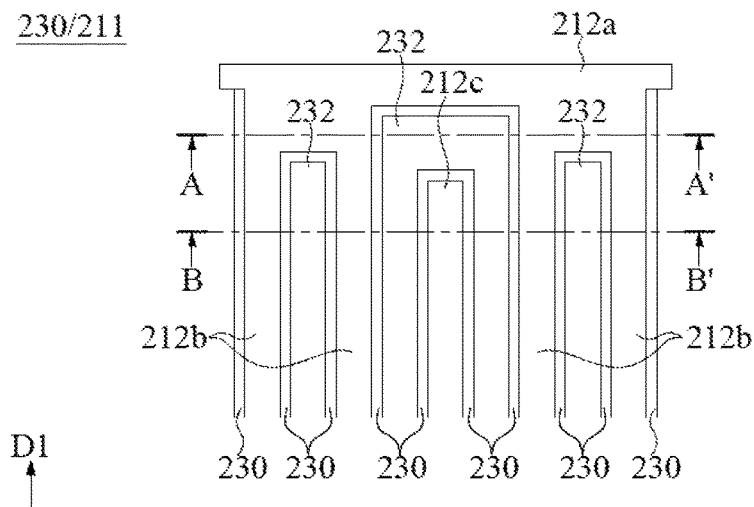
Figure 5B:
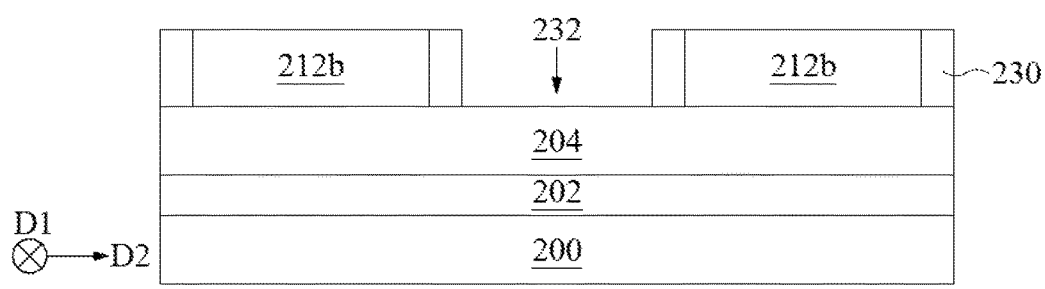
Figure 5C:
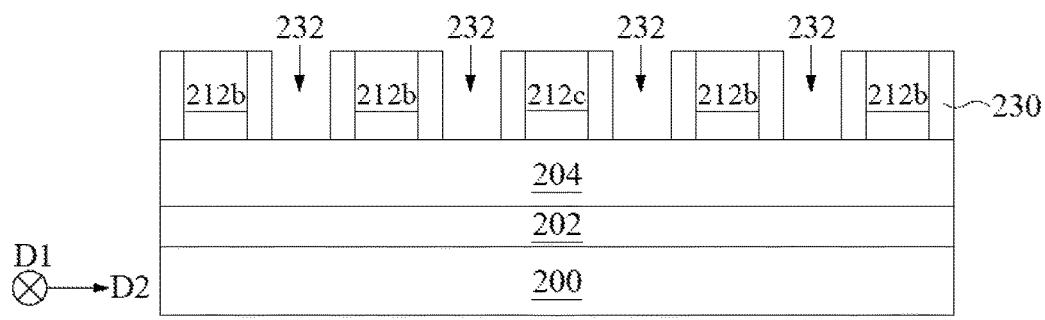

For further understanding of step 106, forming a spacer on the sidewalls of the first core layer, please see FIGS. 5A to 5C. FIGS. 5A to 5C are schematic diagrams illustrating a fabrication stage of the method of forming fine interconnection for semiconductor devices in accordance with some embodiments of the present disclosure, wherein FIG. 5B is a cross-sectional view taken along line A-A' of FIG. 5A, and FIG. 5C is a cross-sectional view taken along line B-B' of FIG. 5A. The top portions of the spacer 230 are removed while leaving the side portions of the spacer 230 on the sidewalls of the first core layer 211, thereby forming the spacer 230 on the sidewalls of the first core layer 211 according to step 106. In some embodiments of the present disclosure, the top portions of the spacer 230 can be removed by performing, for example but not limited to, an anisotropic etching process, as is known in the art of semiconductor manufacturing.

Referring to FIGS. 5A to 5C, after the top portions of the spacer 230 are removed, the top surface of the first core layer 211 are uncovered. Additionally, the substrate 200 or the hard mask 204 is exposed through recesses 232 in the spacer 230.

Figure 6A:
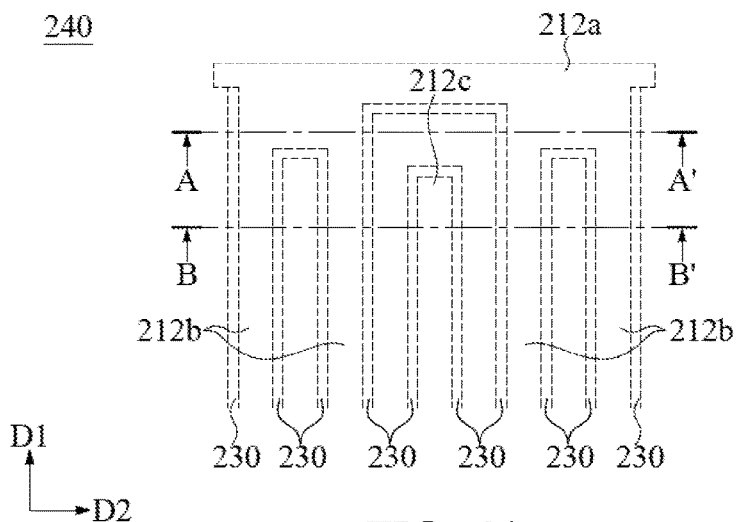
Figure 6B:
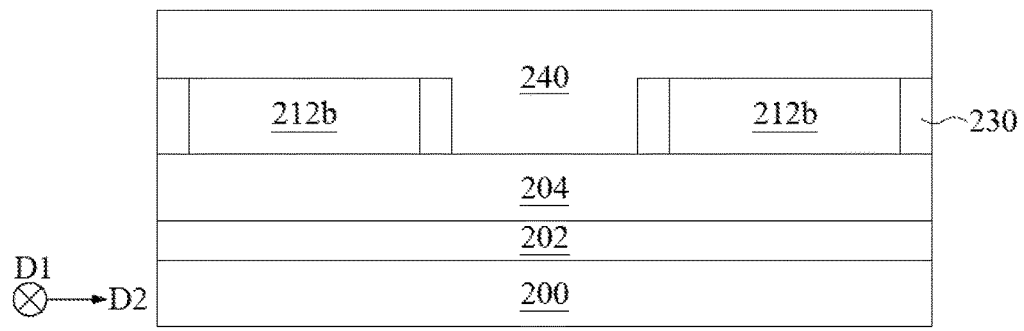
Figure 6C:
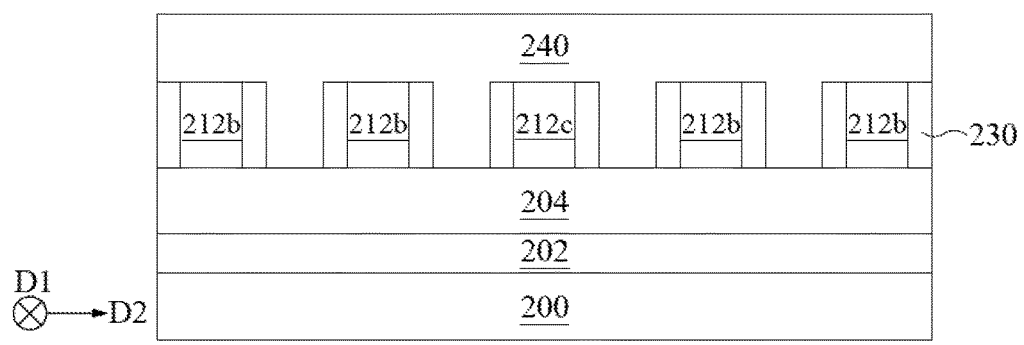

To facilitate understanding of step 108, forming a second core layer, please see FIGS. 6A to 6C. FIGS. 6A to 6C are schematic diagrams illustrating a fabrication stage of the method of forming fine interconnection for semiconductor devices in accordance with some embodiments of the present disclosure, wherein FIG. 6B is a cross-sectional view taken along line A-A' of FIG. 6A, and FIG. 6C is a cross-sectional view taken along line B-B' of FIG. 6A. Referring to FIGS. 6A to 6C, a second sacrificial layer 240 is formed over the substrate 200. The second sacrificial layer 240 is formed on the substrate 200 to fill in the recesses 232 in the spacer 230. The second sacrificial layer 240 can include, for example but not limited to, spin-on dielectrics, and the spin-on dielectrics can include a silicon oxide (SiO) material or a silicon nitride (SiN) material. In some embodiments of the present disclosure, the first sacrificial layer 210 and the second sacrificial layer 240 include the same material.

Figure 7A:
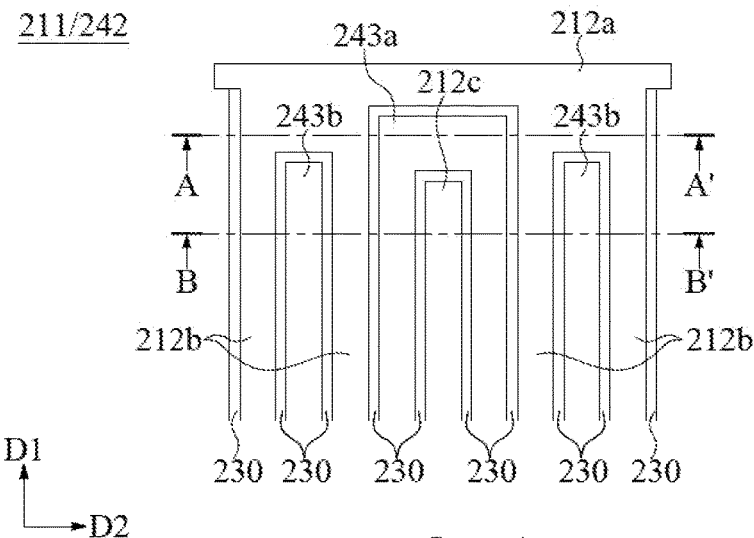
Figure 7B:
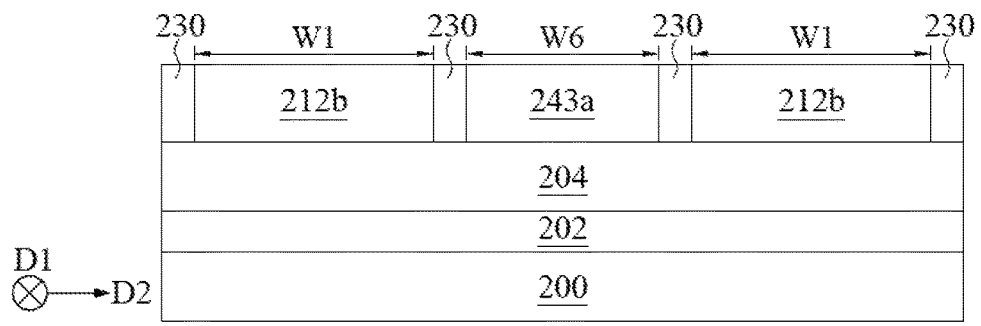
Figure 7C:
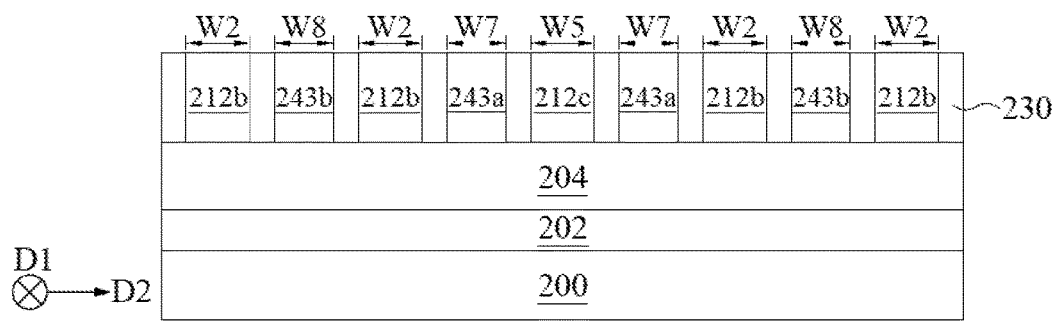

For further understanding of step 108, forming a second core layer, please see FIGS. 7A to 7C. FIGS. 7A to 7C are schematic diagrams illustrating a fabrication stage of the method of forming fine interconnection for semiconductor devices in accordance with some embodiments of the present disclosure, wherein FIG. 7B is a cross-sectional view taken along line A-A' of FIG. 7A, and FIG. 7C is a cross-sectional view taken along line B-B' of FIG. 7A. The top portions of the second sacrificial layer 240 are removed to expose the top surfaces of the first core layer 211 and the spacer 230 covering the sidewalls of the first core layer 211. In some embodiments of the present disclosure, the top portions of the second sacrificial layer 240 can be removed by an etching back process or chemical mechanical planarization, but the disclosure is not limited thereto. Therefore, the second core layer 242 is formed according to step 108.

Referring to FIGS. 7A to 7C, the second core layer 242 includes a plurality of surrounding line portions 243a surrounding the plurality of isolated line portions 212c, and includes a plurality of enclosed line portions 243b enclosed by the plurality of extending line portions 212b. It is to be noticed that after the top portions of the second sacrificial layer 240 be removed, the first core layer 211 is exposed.

The plurality of isolated line portions 212c are surrounded by the plurality of surrounding line portions 243a, and the spacer 230 is sandwiched between the plurality of isolated line portions 212b and the surrounding line portions 243a, as shown in FIG. 7A. In the cross-sectional view of FIG. 7C, the plurality of surrounding line portions 243a are on the two sides of the plurality of isolated line portions 212c and are separated from them by the spacer 230. Besides, the plurality of surrounding line portions 243a are separated from the plurality of extending line portions 212b by the spacer 230. Moreover, the plurality of isolated line portions 212c are separated from the plurality of extending line portions 212b by the plurality of surrounding line portions 243a.

The plurality of enclosed line portions 243b are enclosed by the plurality of extending line portions 212b, and the spacer 230 is sandwiched between the plurality of extending line portions 212b and the enclosed line portions 243b, as shown in FIG. 7A. In the cross-sectional view of FIG. 7C, the plurality of enclosed line portions 243b are between two extending line portions 212b and are separated from them by the spacer 230. Besides, the plurality of enclosed line portions 243b are separated from the plurality of surrounding line portions 243a by the plurality of extending line portions 212b.

Still referring to FIGS. 7A to 7C, in some embodiments of the present disclosure, the first core layer 211 and the second core layer 242 are alternately arranged along the second direction D2. In some embodiments of the present disclosure, the plurality of surrounding line portions 243a have width W6 between the joints, as shown in cross-sectional view of FIG. 7B. Further, the surrounding line portions 243a between the isolated line portions 212c and the extending line portions 212b has a width W7 less than the width W6. Besides, the plurality of enclosed line portions 243b have width W8 on the second direction D2. In some embodiments of the present disclosure, the widths W5 and W8 are essentially identical. In some embodiments of the present disclosure, the widths W2 and W7 are essentially identical. In some embodiments, widths W2, W5, W7 and W8 are essentially identical.

Figure 8A:
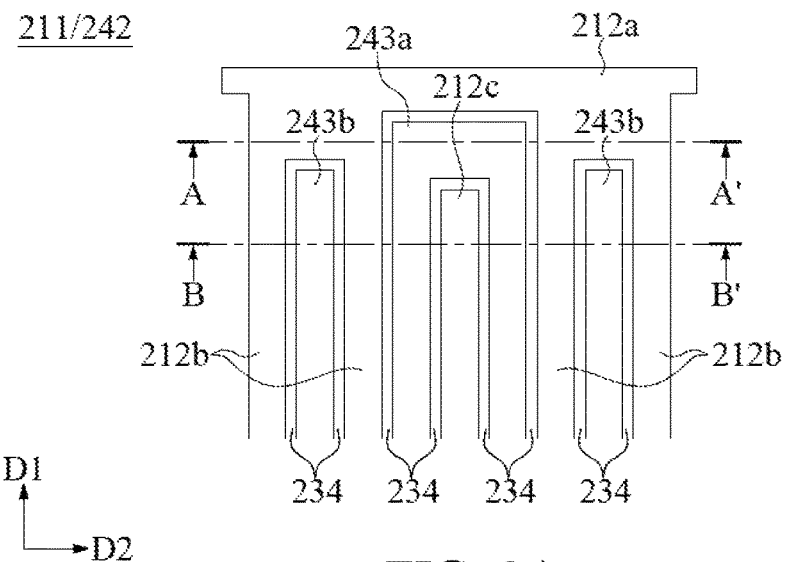
Figure 8B:
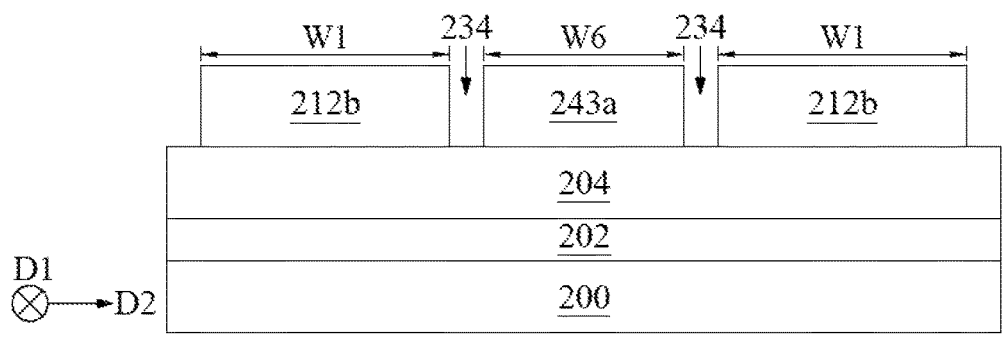
Figure 8C:
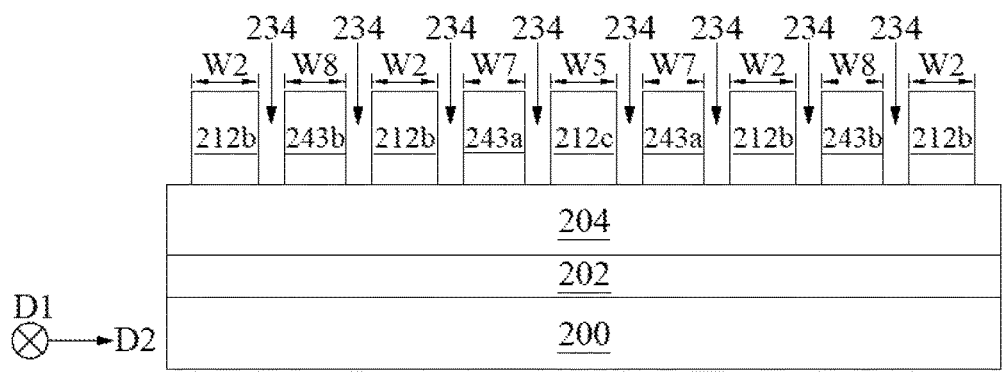

To facilitate understanding of step 110, removing the spacer to form a plurality of openings between the first core layer and the second core layer, please see FIGS. 8A to 8C. FIGS. 8A to 8C are schematic diagrams illustrating a fabrication stage of the method of forming fine interconnection for semiconductor devices in accordance with some embodiments of the present disclosure, wherein FIG. 8B is a cross-sectional view taken along line A-A' of FIG. 8A, and FIG. 8C is a cross-sectional view taken along line B-B' of FIG. 8A. The spacer 230 is removed from the substrate 200 to form a plurality of openings 234 between the first core layer 211 and the second core layer 242 according to step 110. Accordingly, the plurality of isolated line portions 212c, the plurality of extending line portions 212b, the plurality of surrounding line portions 243a, and the plurality of enclosed line portions 243b are spaced apart from each other by the plurality of openings 234. It should be understood that since the etching rate of the first core layer 211 and the second core layer 242 are sufficiently different from the etching rate of the spacer 230, the spacer 230 can be removed without damaging or consuming the first core layer 211 or the second core layer 242, as will be apparent to one of ordinary skill in the art upon consideration of the present disclosure.

Further, in the cross-sectional view of FIG. 8C, the plurality of surrounding line portions 243a are on the two sides of the plurality of isolated line portions 212c and are separated from them by the openings 234. Besides, still in FIG. 8C, the plurality of extending line portions 212b are on the two sides of the plurality of enclosed line portions 243b and are separated from them by the openings 234.

Figure 9:
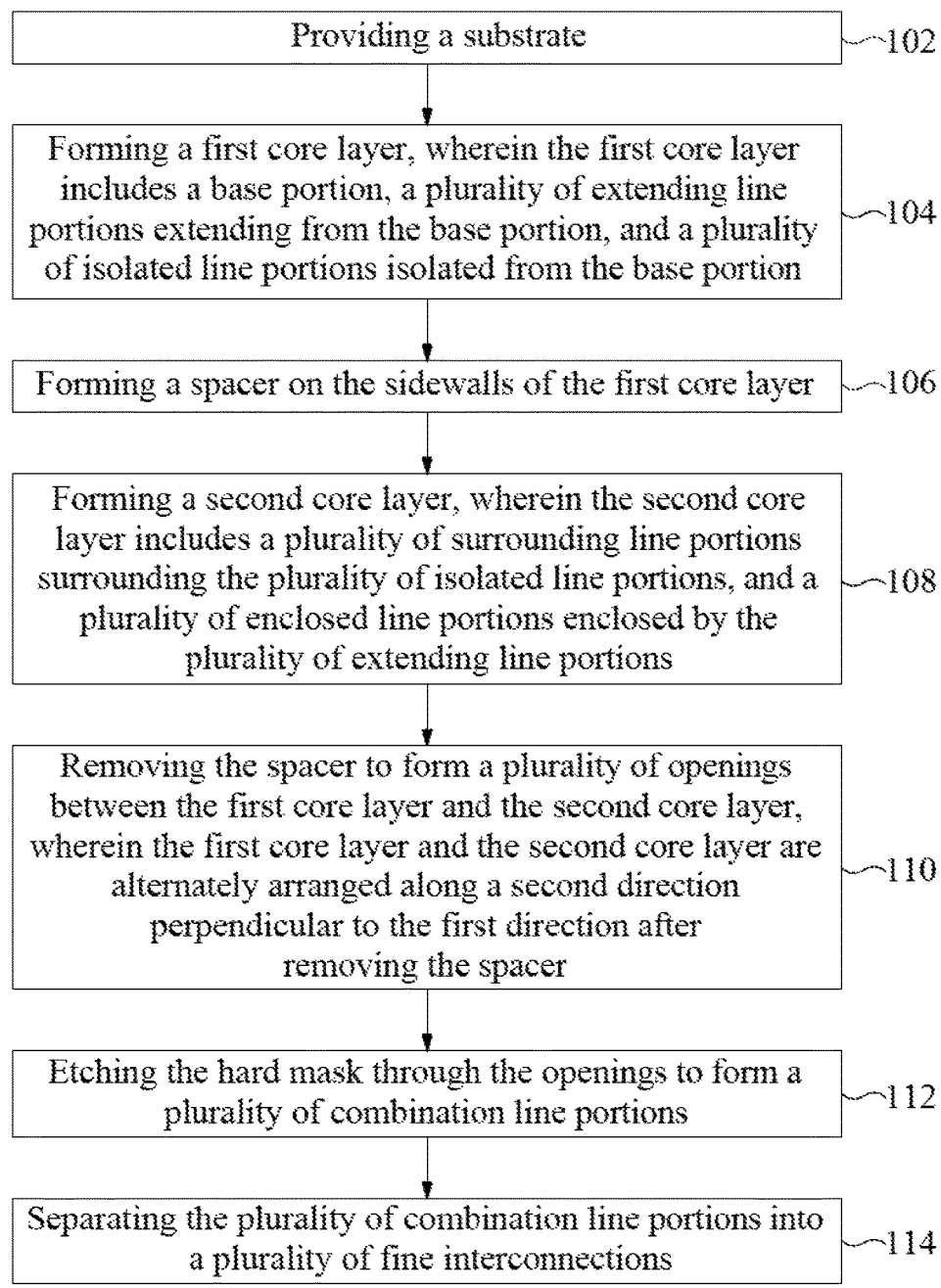
FIG. 9 is a flow diagram illustrating a method of forming fine interconnection for semiconductor devices, in accordance with some embodiments of the present disclosure.

FIG. 9 is a flow diagram illustrating a method of forming fine interconnection for semiconductor devices, in accordance with some embodiments of the present disclosure. Since steps 102 to 110 are similar to those described above in relation to FIG. 1, such similar details are omitted in the interest of brevity, and the differences are provided.

Still referring to FIG. 9, after step 110, the method 10' of forming fine interconnection for semiconductor devices proceeds to step 112, etching the hard mask through the openings to form a plurality of combination line portions. The method 10 of forming fine interconnection for semiconductor devices further includes a step 114, separating the plurality of combination line portions into a plurality of fine interconnections. The method 10 of forming fine interconnection for semiconductor devices will be further described according to one or more embodiments.

Figure 10A:
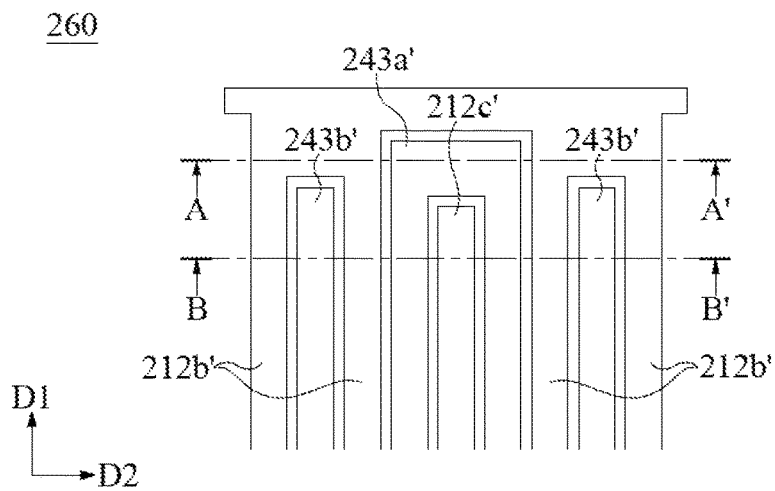
Figure 10B:
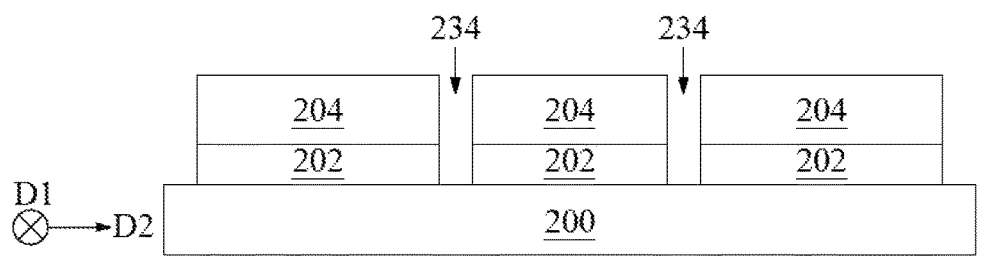
Figure 10C:
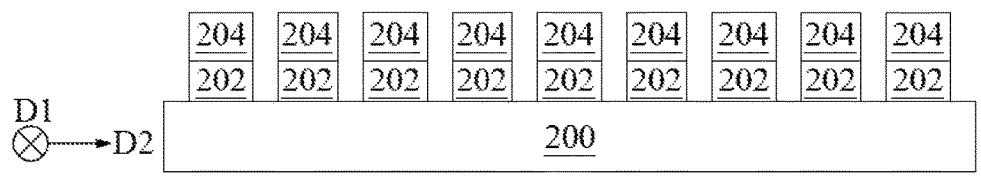

To facilitate understanding of step 112, etching the hard mask through the openings to form a plurality of combination line portions, please see FIGS. 10A to 10C. FIGS. 10A to 10C are schematic diagrams illustrating a fabrication stage of the method of forming fine interconnection for semiconductor devices in accordance with some embodiments of the present disclosure, wherein FIG. 10B is a cross-sectional view taken along line A-A' of FIG. 10A, and FIG. 10C is a cross-sectional view taken along line B-B' of FIG. 10A. In step 112, the patterns of the first core layer 211 and the second core layer 242 are transferred to the substrate 200 or the target layer 202. In some embodiments of the present disclosure, the hard mask 204 and the target layer 202 are etched through the plurality of openings 234 to form a plurality of combination line portions 260 according to step 112.

Still referring to FIGS. 10A to 10C, it should be easily realized by those skilled in the art that the plurality of combination line portions 260 include the lines as defined by the first core layer 211 and the second core layer 242. The plurality of combination line portions 260 include a plurality of isolated line portions 212c', a plurality of extending line portions 212b', a plurality of surrounding line portions 243a', and a plurality of enclosed line portions 243b'. The identical numbers with single quotation mark "'" represent the same patterns for simplicity of explanation. For example, the plurality of isolated line portions 212c' have the same pattern with the plurality of isolated line portions 212c in FIG. 8A. It should be easily realized by those skilled in the art that the widths and relative positions of the plurality of combination line portions 260 are identical to the first core layer 211 and the second core layer 242, and such similar details are omitted in the interest of brevity.

It is to be noticed that the plurality of combination line portions 260 also have a base portion that is connected to the plurality of extending line portions 212b', but such portion is omitted in the following descriptions for the sake of concision.

Figure 11A:
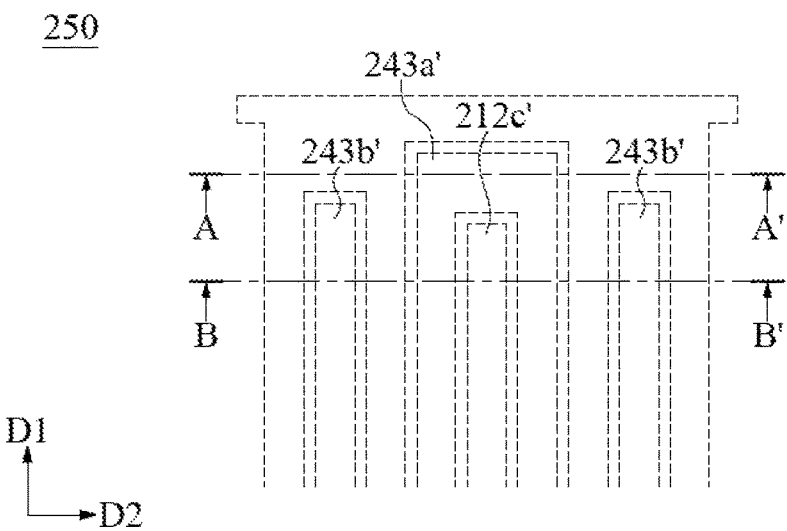
Figure 11B:
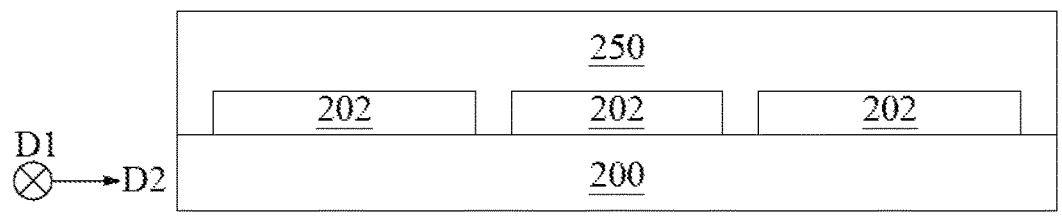
Figure 11C:
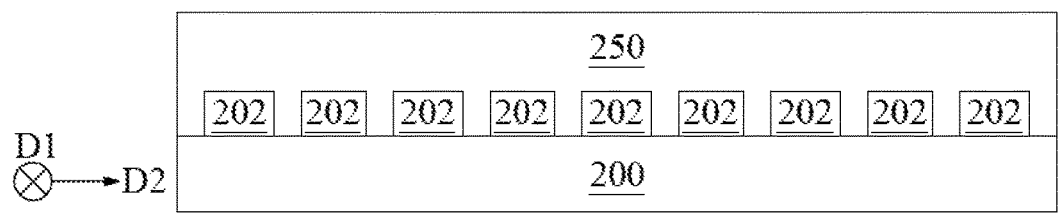

To facilitate understanding of step 114, separating the plurality of combination line portions into a plurality of fine interconnections, please see FIGS. 11A to 11C. FIGS. 11A to 11C are schematic diagrams illustrating a fabrication stage of the method of forming fine interconnection for semiconductor devices in accordance with some embodiments of the present disclosure, wherein FIG. 11B is a cross-sectional view taken along line A-A' of FIG. 11A, and FIG. 11C is a cross-sectional view taken along line B-B' of FIG. 11A. After step 112, the hard mask 204 is removed. Next, a third sacrificial layer 250 is formed over the substrate 200. The third sacrificial layer 250 is formed on the substrate 200 to fill the gaps between the plurality of combination line portions 260. In some embodiments of the present disclosure, the third sacrificial layer 250 can include materials similar to those of the first sacrificial layer 210 or the second sacrificial layer 240, but the disclosure is not limited thereto.

Figure 12A:
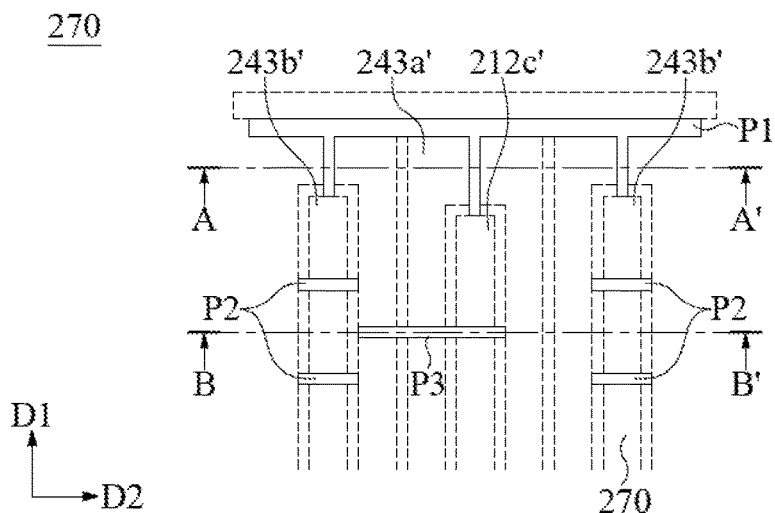
Figure 12B:
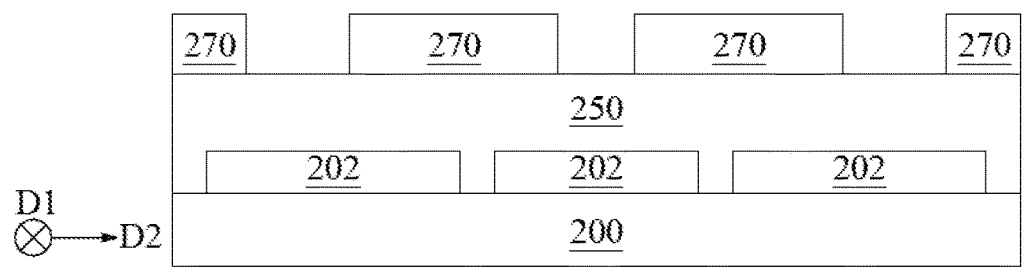
Figure 12C:
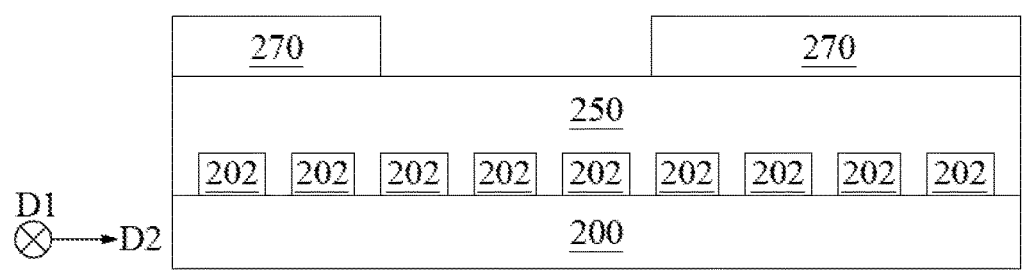

For further understanding of step 114, separating the plurality of combination line portions into a plurality of fine interconnections, please see FIGS. 12A to 12C. FIGS. 12A to 12C are schematic diagrams illustrating a fabrication stage of the method of forming fine interconnection for semiconductor devices in accordance with some embodiments of the present disclosure, wherein FIG. 12B is a cross-sectional view taken along line A-A' of FIG. 12A, and FIG. 12C is a cross-sectional view taken along line B-B' of FIG. 12A. A positive photoresist 270 is formed over the third sacrificial layer 250 as shown in FIGS. 12A to 12C. The positive photoresist 270 can include lines formed by performing, for example but not limited to, conventional photolithography, as is known in the art of semiconductor manufacturing. In some embodiments of the present disclosure, a trimming step can be performed on the positive photoresist 270, such that a width of the positive photoresist 270 can be further reduced. However, in some embodiments of the present disclosure, when the positive photoresist 270 including the desired width is formed by the conventional photolithography, the trimming step can be omitted.

Referring to FIG. 12A, the openings P1, P2, and P3 of the positive photoresist 270 are illustrated by solid lines, wherein portions of the third sacrificial layer 250 are exposed through the openings P1, P2, and P3. The plurality of isolated line portions 212c', the plurality of extending line portions 212b', the plurality of surrounding line portions 243a', and the plurality of enclosed line portions 243b' under the exposed third sacrificial layer 250 will be etched away.

Figure 13A:
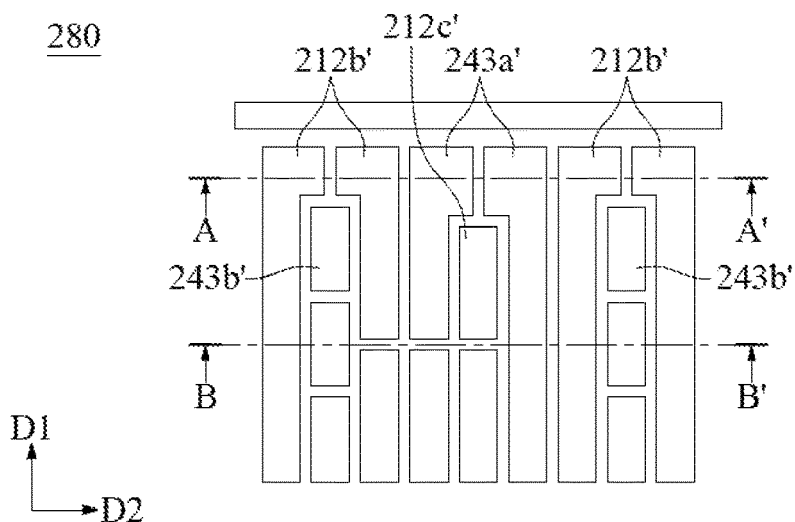
Figure 13B:
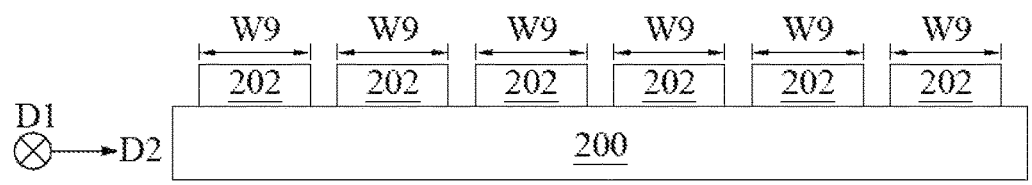
Figure 13C:
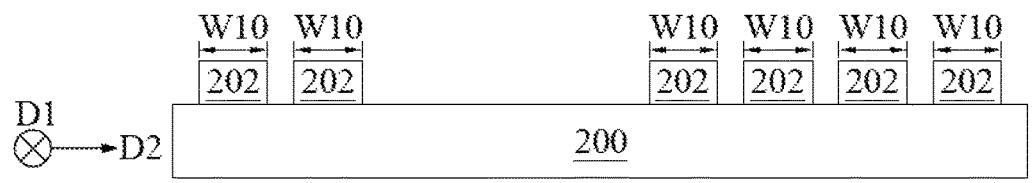

For additional illustration of step 114, separating the plurality of combination line portions into a plurality of fine interconnections, please see FIGS. 13A to 13C. FIGS. 13A to 13C are schematic diagrams illustrating a fabrication stage of the method of forming fine interconnection for semiconductor devices in accordance with some embodiments of the present disclosure, wherein FIG. 13B is a cross-sectional view taken along line A-A' of FIG. 13A, and FIG. 13C is a cross-sectional view taken along line B-B' of FIG. 13A. After the positive photoresist 270 is formed, the third sacrificial layer 250 and the target layer 202 are etched through the openings P1, P2, and P3 of the positive photoresist 270. Therefore, the plurality of combination line portions 260 are separated into a plurality of fine interconnections 280 according to step 114.

Referring to FIGS. 12A and 13A, the plurality of extending line portions 212b' are isolated from the base portion and divided due to the opening P1. The plurality of isolated line portions 212c' are further sectioned by the opening P3. The plurality of surrounding line portions 243a' are divided due to the opening P1 and further sectioned by the opening P3. The plurality of enclosed line portions 243b' are divide into several lines due to the opening P2.

Referring to FIG. 13B, in some embodiments of the present disclosure, the widths W9 in the second direction of the plurality of fine interconnections are essentially identical. Referring to FIG. 13C, in some embodiments of the present disclosure, the widths W10 in the second direction of the plurality of fine interconnections are essentially identical.

The present disclosure provides a method of forming fine interconnection for semiconductor devices. The method includes the following steps: A substrate is provided. A first core layer is formed over the substrate. The first core layer includes a base portion, a plurality of extending line portions extending from the base portion along a first direction, and a plurality of isolated line portions isolated from the base portion. Subsequently, a spacer is formed on the sidewalls of the first core layer. A second core layer is then formed over the substrate. The second core layer includes a plurality of surrounding line portions surrounding the plurality of isolated line portions, and includes a plurality of enclosed line portions enclosed by the plurality of extending line portions. The spacer is removed to form a plurality of openings between the first core layer and the second core layer. The first core layer and the second core layer are alternately arranged along a second direction perpendicular to the first direction after removing the spacer.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming fine interconnection for semiconductor devices, comprising:
    providing a substrate;
    forming a first core layer over the substrate, wherein the first core layer includes a base portion, a plurality of extending line portions extending from the base portion along a first direction, and a plurality of isolated line portions isolated from the base portion;
    forming a spacer on the sidewalls of the first core layer;
    to forming a second core layer over the substrate, wherein the second core layer includes a plurality of surrounding line portions surrounding the plurality of isolated line portions, and includes a plurality of enclosed line portions enclosed by the plurality of extending line portions; and
    removing the spacer to form a plurality of openings between the first core layer and the second core layer, wherein the first core layer and the second core layer are alternately arranged along a second direction perpendicular to the first direction after removing the spacer.

2. The method of claim 1, wherein the plurality of isolated line portions are separated from the plurality of extending line portions by the plurality of surrounding line portions.

3. The method of claim 1, in a cross-sectional view taken along the second direction, the widths in the second direction of the plurality of isolated line portions, the plurality of extending line portions, the plurality of surrounding line portions, and the plurality of enclosed line portions are essentially identical.

4. The method of claim 1, wherein the first core layer and the second core layer comprise the same material.

5. The method of claim 1, wherein forming the spacer on the sidewalls of the first core layer further comprises:
    forming the spacer over the first sacrificial layer; and
    removing the top portions of the spacer while leaving the side portions of the spacer on the sidewalls of the first core layer.

6. The method of claim 1, wherein forming the second core layer further comprises:
    forming a second sacrificial layer on the substrate; and
    removing the top portions of the second sacrificial layer to expose the first core layer and the spacer covering the sidewalls of the first core layer.

7. The method of claim 1, wherein the first core layer includes another base portion, wherein the plurality of extending line portions are connected between the two base portions.

8. The method of claim 7, wherein the plurality of isolated line portions are isolated from the another base portion.

9. The method of claim 1, wherein forming the first core layer further comprises:
    forming a first sacrificial layer over the substrate;
    forming a patterned photoresist over the first sacrificial layer; and
    etching the first sacrificial layer through the patterned photoresist to form the first core layer.

10. The method of claim 9, wherein forming the first core layer further comprises:
    performing a trimming step on the patterned photoresist before etching the first sacrificial layer.

11. The method of claim 1, wherein the plurality of isolated line portions, the plurality of extending line portions, the plurality of surrounding line portions, and the plurality of enclosed line portions are spaced apart from each other by the plurality of openings.

12. The method of claim 11, wherein in a cross-sectional view taken along the second direction, the plurality of surrounding line portions are on the two sides of the plurality of isolated line portions and are separated from them by the plurality of openings.

13. The method of claim 11, wherein in a cross-sectional view taken along the second direction, the plurality of extending line portions are on the two sides of the plurality of enclosed line portions and are separated from them by the plurality of openings.

14. The method of claim 1, wherein the substrate further comprises a hard mask formed thereon.

15. The method of claim 14, further comprising:
    etching the hard mask through the plurality of openings to form a plurality of combination line portions; and
    separating the plurality of combination line portions into a plurality of fine interconnections.

16. The method of claim 15, wherein the plurality of fine interconnections include metal pads.

17. The method of claim 15, wherein separating the plurality of combination line portions into the plurality of fine interconnections further comprises:
    stripping the hard mask away;
    forming a third sacrificial layer over the substrate;
    forming a positive photoresist over the third sacrificial layer; and
    etching the third sacrificial layer through the positive photoresist to form the plurality of fine interconnections.

18. The method of claim 15, in a cross-sectional view taken along the second direction, the widths in the second direction of the plurality of fine interconnections are essentially identical.

* * * * *